United States Patent
Ho

(10) Patent No.: US 7,859,228 B2
(45) Date of Patent: Dec. 28, 2010

(54) GENERATING METHOD AND APPARATUS TO GENERATE ELECTRIC POWER BY USING TEMPERATURE DIFFERENCE

(75) Inventor: Wen-Hsin Ho, Taoyuan (TW)

(73) Assignee: Ho Shin Enterprise Co., Ltd., Taoyuan (TW)

( * ) Notice: Subject to any disclaimer, the term of this patent is extended or adjusted under 35 U.S.C. 154(b) by 629 days.

(21) Appl. No.: 11/942,936

(22) Filed: Nov. 20, 2007

(65) Prior Publication Data

US 2008/0122398 A1      May 29, 2008

(30) Foreign Application Priority Data

Nov. 27, 2006   (TW) ............................... 95143913 A

(51) Int. Cl.
*H01M 10/44* (2006.01)
*H01M 10/46* (2006.01)
(52) U.S. Cl. ...................................... 320/150
(58) Field of Classification Search ................ 320/101, 320/107, 114, 150; 322/2 R, 3, 100; 310/300, 310/12.01
See application file for complete search history.

(56) References Cited

U.S. PATENT DOCUMENTS

| 3,310,689 | A | * | 3/1967 | Heinmets | 310/306 |
| 6,854,881 | B2 | * | 2/2005 | Nada | 374/169 |
| 2004/0083731 | A1 | * | 5/2004 | Lasker | 60/645 |
| 2004/0232252 | A1 | * | 11/2004 | Paul et al. | 237/28 |

* cited by examiner

*Primary Examiner*—Edward Tso
(74) *Attorney, Agent, or Firm*—Alan Kamrath; Kamrath & Associates PA

(57) ABSTRACT

A generating method or apparatus can generate an electric power by using a temperature difference. The generating apparatus includes a higher temperature portion, at least one coil, a lower temperature portion, and at least one magnet. Thus, the magnet is heated or cooled by a temperature difference between the higher temperature portion and the lower temperature portion, and the magnetic force of the magnet changes at a predetermined Curie temperature, so that the magnet is movable reciprocally between the iron core of the higher temperature portion and the lower temperature portion by a temperature difference between the higher temperature portion and the lower temperature portion to change a magnetic flux in the iron core and to produce a pulse voltage or current in the coil successively so as to generate an electric power.

18 Claims, 5 Drawing Sheets

GENERATING METHOD AND APPARATUS TO GENERATE ELECTRIC POWER BY USING TEMPERATURE DIFFERENCE

BACKGROUND OF THE INVENTION

1. Field of the Invention

The present invention relates to a generating method and apparatus and, more particularly, to a generating method and apparatus to generate an electric power by using a temperature difference.

2. Description of the Related Art

In the modern life, many heat sources are wasted and not recycled and reused. For example, the wasted heat source includes the high temperature waste water from a steam turbine of a power plant, the higher temperature seawater at the sea level, the circulation cooling water for dissipating heat of a car, the hot air drained from the engine, the waste heat produced by a factory and the circulation hot water from a roof or road. Therefore, it is necessary to reuse or recycle the wasted heat sources to prevent waste of the resource and to prevent the wasted heat sources from causing an environmental pollution.

BRIEF SUMMARY OF THE INVENTION

In accordance with one embodiment of the present invention, there is provided a generating method using a temperature difference, comprising providing a higher temperature portion which includes at least one iron core and has a first temperature greater than a predetermined Curie temperature, providing at least one coil which surrounds the iron core of the higher temperature portion, providing a lower temperature portion which has a second temperature smaller than the predetermined Curie temperature, providing at least one magnet which is movable reciprocally between the iron core of the higher temperature portion and the lower temperature portion, wherein the magnet has a magnetic force that exists when a third temperature of the magnet is smaller than the predetermined Curie temperature and disappears when the third temperature of the magnet is greater than the predetermined Curie temperature, and providing at least one elastic member between the magnet and the lower temperature portion.

In accordance with another embodiment of the present invention, there is provided a generating apparatus using a temperature difference, comprising a higher temperature portion including at least one iron core and having a first temperature greater than a predetermined Curie temperature, at least one coil surrounding the iron core of the higher temperature portion, a lower temperature portion having a second temperature smaller than the predetermined Curie temperature, at least one magnet mounted on the lower temperature portion and movable reciprocally between the iron core of the higher temperature portion and the lower temperature portion, wherein the magnet has a magnetic force that exists when a third temperature of the magnet is smaller than the predetermined Curie temperature and disappears when the third temperature of the magnet is greater than the predetermined Curie temperature, and at least one elastic member mounted between the magnet and the lower temperature portion to pull the magnet toward the lower temperature portion.

In accordance with a further embodiment of the present invention, there is provided a generating apparatus using a temperature difference, comprising a higher temperature portion including at least one pair of iron cores and having a first temperature greater than a predetermined Curie temperature, at least one pair of coils each surrounding a respective iron core of the higher temperature portion, a lower temperature portion having a second temperature smaller than the predetermined Curie temperature, a seesaw mechanism mounted on the lower temperature portion and including a pivot plate pivotable relative to the lower temperature portion, and at least one pair of magnets mounted on two opposite ends of the pivot plate of the seesaw mechanism respectively to move therewith and each movable reciprocally between a respective iron core of the higher temperature portion and the lower temperature portion, wherein each of the pair of magnets has a magnetic force that exists when a third temperature of each of the pair of magnets is smaller than the predetermined Curie temperature and disappears when the third temperature of each of the pair of magnets is greater than the predetermined Curie temperature.

The primary objective of the present invention is to provide a generating method and apparatus to generate an electric power by using a temperature difference and a height difference.

Another objective of the present invention is to provide a generating method and apparatus, wherein the magnet is heated or cooled by a temperature difference between the higher temperature portion and the lower temperature portion, and the magnetic force of the magnet changes at the predetermined Curie temperature, so that the magnet is movable reciprocally between the iron core of the higher temperature portion and the lower temperature portion by a temperature difference between the higher temperature portion and the lower temperature portion to change a magnetic flux in the iron core of the higher temperature portion and to produce a pulse voltage or current in the coil successively and repeatedly so as to generate an electric power.

A further objective of the present invention is to provide a generating method and apparatus, wherein the heat source is got easily in an inexpensive or a free manner, thereby decreasing the price of the generating apparatus.

A further objective of the present invention is to provide a generating method and apparatus, wherein the generating apparatus is operated under a smaller temperature difference between the higher temperature portion and the lower temperature portion, thereby increasing the working efficiency.

A further objective of the present invention is to provide a generating method and apparatus, wherein the generating apparatus has a simplified construction, produces a lower noise and will not cause an environmental pollution.

A further objective of the present invention is to provide a generating method and apparatus, wherein the generating apparatus has a longer lifetime without needing maintenance.

A further objective of the present invention is to provide a generating method and apparatus, wherein the generating apparatus is operated safely and reliably.

Further benefits and advantages of the present invention will become apparent after a careful reading of the detailed description with appropriate reference to the accompanying drawings.

BRIEF DESCRIPTION OF THE SEVERAL VIEWS OF THE DRAWING(S)

DETAILED DESCRIPTION OF THE INVENTION

Figure 1:
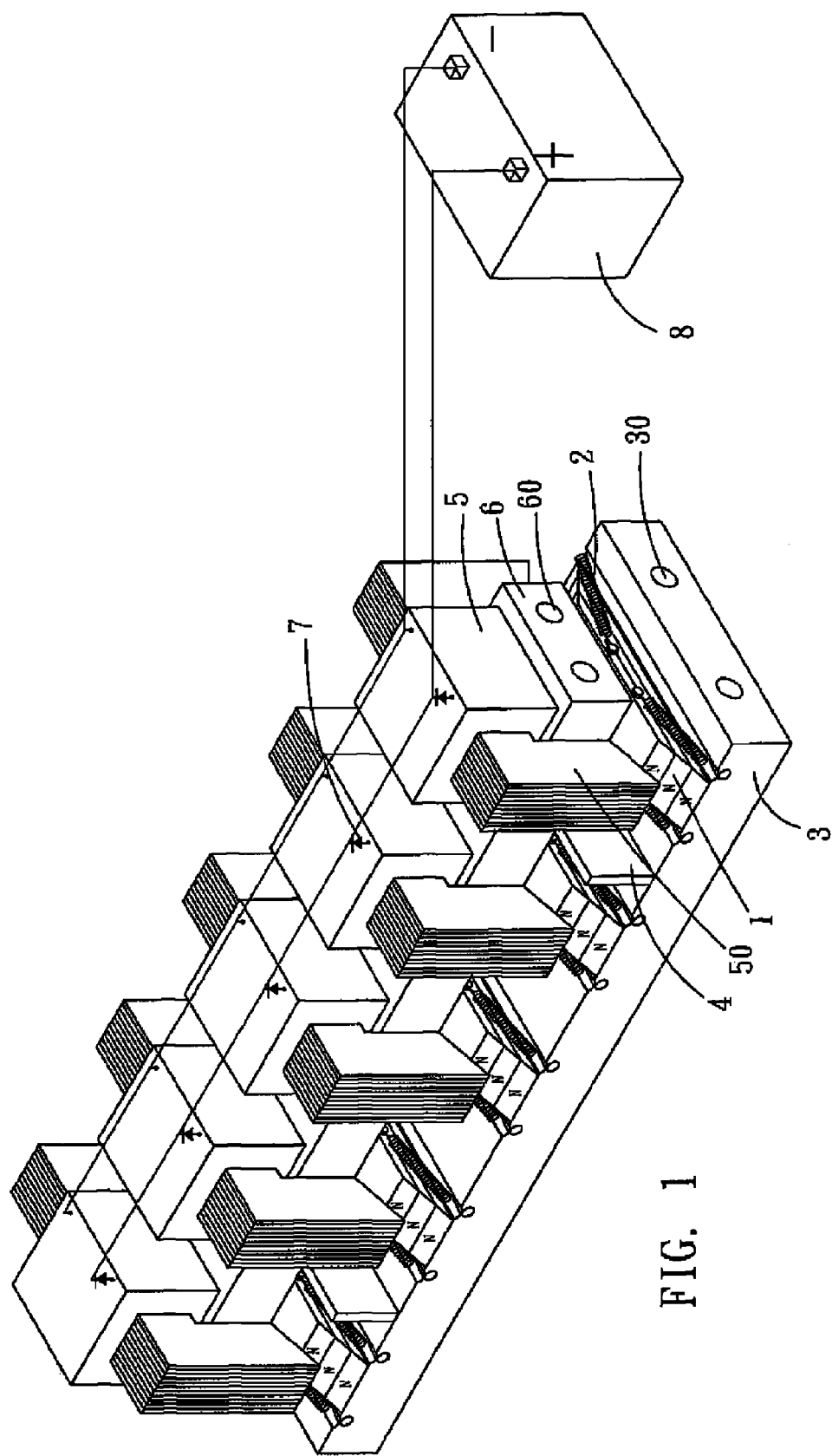
FIG. 1 is a perspective view of a generating apparatus in accordance with the preferred embodiment of the present invention.
Figure 2:
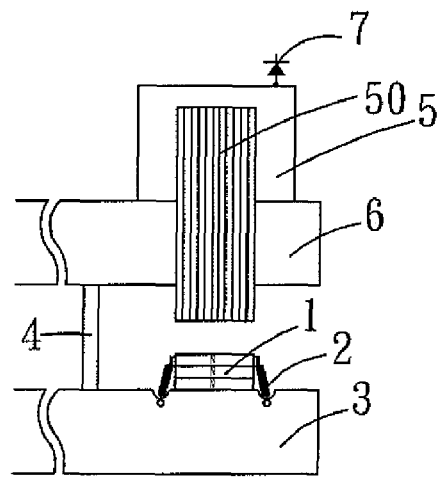
FIG. 2 is a partially front view of the generating apparatus as shown in FIG. 1.
Figure 3:
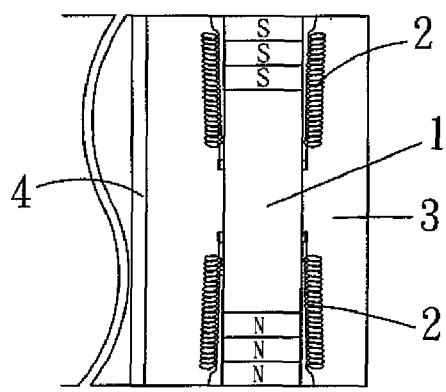
FIG. 3 is a partially top view of the generating apparatus as shown in FIG. 1.
Figure 4:
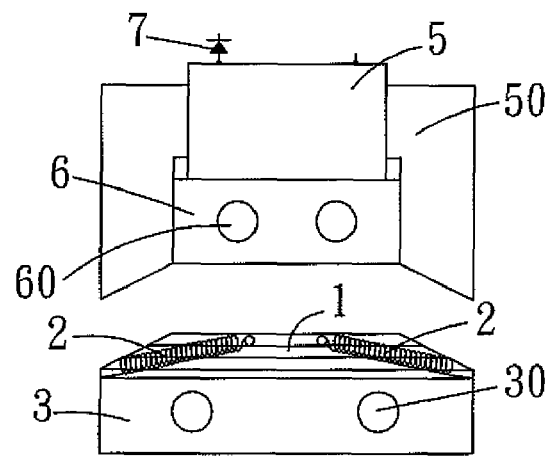
FIG. 4 is a partially side view of the generating apparatus as shown in FIG. 1.

The present invention provides a generating method using a temperature difference, comprising providing a higher temperature portion which includes at least one iron core and has a first temperature greater than a predetermined Curie temperature, providing at least one coil which surrounds the iron core of the higher temperature portion, providing a lower temperature portion which has a second temperature smaller than the predetermined Curie temperature, providing at least one magnet which is movable reciprocally between the iron core of the higher temperature portion and the lower temperature portion, wherein the magnet has a magnetic force that exists when a third temperature of the magnet is smaller than the predetermined Curie temperature and disappears when the third temperature of the magnet is greater than the predetermined Curie temperature, and providing at least one elastic member between the magnet and the lower temperature portion.

The higher temperature portion is preheated by a heat source (not shown) to have the first temperature greater than the predetermined Curie temperature, and the lower temperature portion is located at a height smaller than that of the higher temperature portion and cooled by a cold source (not shown) to have the second temperature smaller than the predetermined Curie temperature. Preferably, the predetermined Curie temperature is a mean value of the first temperature of the higher temperature portion and the second temperature of the lower temperature portion.

In such a manner, when the magnet touches the lower temperature portion, the magnet is cooled, and the third temperature of the magnet is decreased until the third temperature of the magnet is smaller than the predetermined Curie temperature so that the magnetic force of the magnet exists, and the magnet is movable toward the iron core of the higher temperature portion by a magnetically attractive force between the iron core of the higher temperature portion and the magnet.

On the other hand, when the magnet touches the iron core of the higher temperature portion, the magnet is heated, and the third temperature of the magnet is increased until the third temperature of the magnet is greater than the predetermined Curie temperature so that the magnetic force of the magnet disappears to remove the magnetically attractive force between the iron core of the higher temperature portion and the magnet, and the magnet is movable toward the lower temperature portion by a restoring force of the elastic member (or other biasing member).

Thus, the magnet is heated or cooled by a temperature difference between the higher temperature portion and the lower temperature portion, and the magnetic force of the magnet changes at the predetermined Curie temperature, so that the magnet is movable reciprocally between the iron core of the higher temperature portion and the lower temperature portion by a temperature difference and a height difference between the higher temperature portion and the lower temperature portion to change a magnetic flux in the iron core of the higher temperature portion and to produce a pulse voltage or current in the coil successively and repeatedly so as to generate an electric power.

Referring to the drawings and initially to FIGS. 1-4, a generating apparatus using a temperature difference in accordance with the preferred embodiment of the present invention comprises a higher temperature portion to including at least one iron core 50 and having a first temperature greater than a predetermined Curie temperature, at least one coil 5 surrounding the iron core 50 of the higher temperature portion, a lower temperature portion 3 having a second temperature smaller than the predetermined Curie temperature, at least one magnet 1 mounted on the lower temperature portion 3 and movable reciprocally between the iron core 50 of the higher temperature portion and the lower temperature portion 3, wherein the magnet 1 has a magnetic force that exists when a third temperature of the magnet 1 is smaller than the predetermined Curie temperature and disappears when the third temperature of the magnet 1 is greater than the predetermined Curie temperature, and at least one elastic member 2 mounted between the magnet 1 and the lower temperature portion 3 to pull the magnet 1 toward the lower temperature portion 3.

The higher temperature portion is preheated by a heat source (not shown) to have the first temperature greater than the predetermined Curie temperature, and the lower temperature portion 3 is located at a height smaller than that of the higher temperature portion and cooled by a cold source (not shown) to have the second temperature smaller than the predetermined Curie temperature. Preferably, the lower temperature portion 3 is a heatsink.

The higher temperature portion further includes a heat conducting member 6 connected to the heat source and located above the magnet 1 to support the iron core 50. Thus, the iron core 50 and the heat conducting member 6 of the higher temperature portion are preheated by the heat source to have the first temperature greater than the predetermined Curie temperature. The generating apparatus further comprises a support frame 4 mounted between the lower temperature portion 3 and the heat conducting member 6 of the higher temperature portion to space the iron core 50 of the higher temperature portion from the magnet 1 on the lower temperature portion 3, at least one rectifier 7 mounted on the coil 5, and a storage battery 8 connected between the rectifier 7 and the coil 5. In the preferred embodiment of the present invention, the elastic member 2 is a made of a non-magnetic material, the lower temperature portion 3 (that is a heatsink) is a made of a heat conductive and non-magnetic material, and the heat conducting member 6 of the higher temperature portion is a made of a heat conductive and non-magnetic material.

In operation, when the magnet 1 touches the lower temperature portion 3, the magnet 1 is cooled, and the third temperature of the magnet 1 is decreased until the third temperature of the magnet 1 is smaller than the predetermined Curie temperature so that the magnetic force of the magnet 1 exists. In such a manner, the magnetically attractive force between the iron core 50 of the higher temperature portion and the magnet 1 overcomes the gravity of the magnet 1 and the elastic force of the elastic member 2 so that the magnet 1 is movable toward the iron core 50 of the higher temperature portion to change a magnetic flux in the iron core 50 of the higher temperature portion and to induce a pulse voltage or current in the coil 5. Then, the pulse voltage or current in the coil 5 is rectified by the rectifier 7 to charge the storage battery 8 so that the storage battery 8 obtains a charging unit.

On the other hand, when the magnet 1 touches the iron core 50 of the higher temperature portion, the magnet 1 is heated, and the third temperature of the magnet 1 is increased until the third temperature of the magnet 1 is greater than the predetermined Curie temperature so that the magnetic force of the magnet 1 disappears to remove the magnetically attractive force between the iron core 50 of the higher temperature portion and the magnet 1. In such a manner, the magnetically attractive force between the iron core 50 of the higher temperature portion and the magnet 1 disappears and cannot overcome the gravity of the magnet 1 and the elastic force of the elastic member 2 so that the magnet 1 is movable toward the lower temperature portion 3 by a restoring force of the elastic member 2.

Further, when the magnet 1 touches the lower temperature portion 3 again, the magnet 1 is cooled, and the third temperature of the magnet 1 is decreased until the third temperature of the magnet 1 is smaller than the predetermined Curie temperature so that the magnetic force of the magnet 1 is restored. In such a manner, the magnetically attractive force between the iron core 50 of the higher temperature portion and the magnet 1 overcomes the gravity of the magnet 1 and the elastic force of the elastic member 2 so that the magnet 1 is movable toward the iron core 50 of the higher temperature portion to induce another pulse voltage or current in the coil 5 to charge the storage battery 8 so that the storage battery 8 obtains another charging unit. The above-mentioned procedures are repeated continuously to generate an electric power so as to charge the storage battery 8 successively.

It is to be noted that the generating apparatus is operated successively when the temperature difference exists, that is, when the higher temperature portion is heated to have the first temperature greater than the predetermined Curie temperature, and the lower temperature portion 3 is cooled to have the second temperature smaller than the predetermined Curie temperature. On the contrary, the generating apparatus will stop operating when the heat source disappears or when the cooling effect is poor.

Thus, the magnet 1 is heated or cooled by a temperature difference between the higher temperature portion and the lower temperature portion 3, and the magnetic force of the magnet 1 changes at the predetermined Curie temperature, so that the magnet 1 is movable reciprocally between the iron core 50 of the higher temperature portion and the lower temperature portion 3 by a temperature difference and a height difference between the higher temperature portion and the lower temperature portion 3 to change a magnetic flux in the iron core 50 of the higher temperature portion and to produce a pulse voltage or current in the coil 5 so as to generate an electric power.

Accordingly, the heat source is got easily in an inexpensive or a free manner, thereby decreasing the price of the generating apparatus. In addition, the generating apparatus is operated under a smaller temperature difference between the higher temperature portion and the lower temperature portion 3, thereby increasing the working efficiency. Further, the generating apparatus has a simplified construction, produces a lower noise and will not cause an environmental pollution. Further, the generating apparatus has a longer lifetime without needing maintenance. Further, the generating apparatus is operated safely and reliably.

In the preferred embodiment of the present invention the heat conducting member 6 of the higher temperature portion has a plurality of conducting holes 60 to allow passage of a fluid type heat source, such as high temperature waste water from a power plant, higher temperature seawater at the sea level, circulation cooling water for dissipating heat of a car, hot air drained from the engine and circulation hot water from a roof or road. In addition, the lower temperature portion 3 has a plurality of conducting holes 30 to allow passage of a cooling fluid so as to cool the lower temperature portion 3 forcibly.

Figure 5:
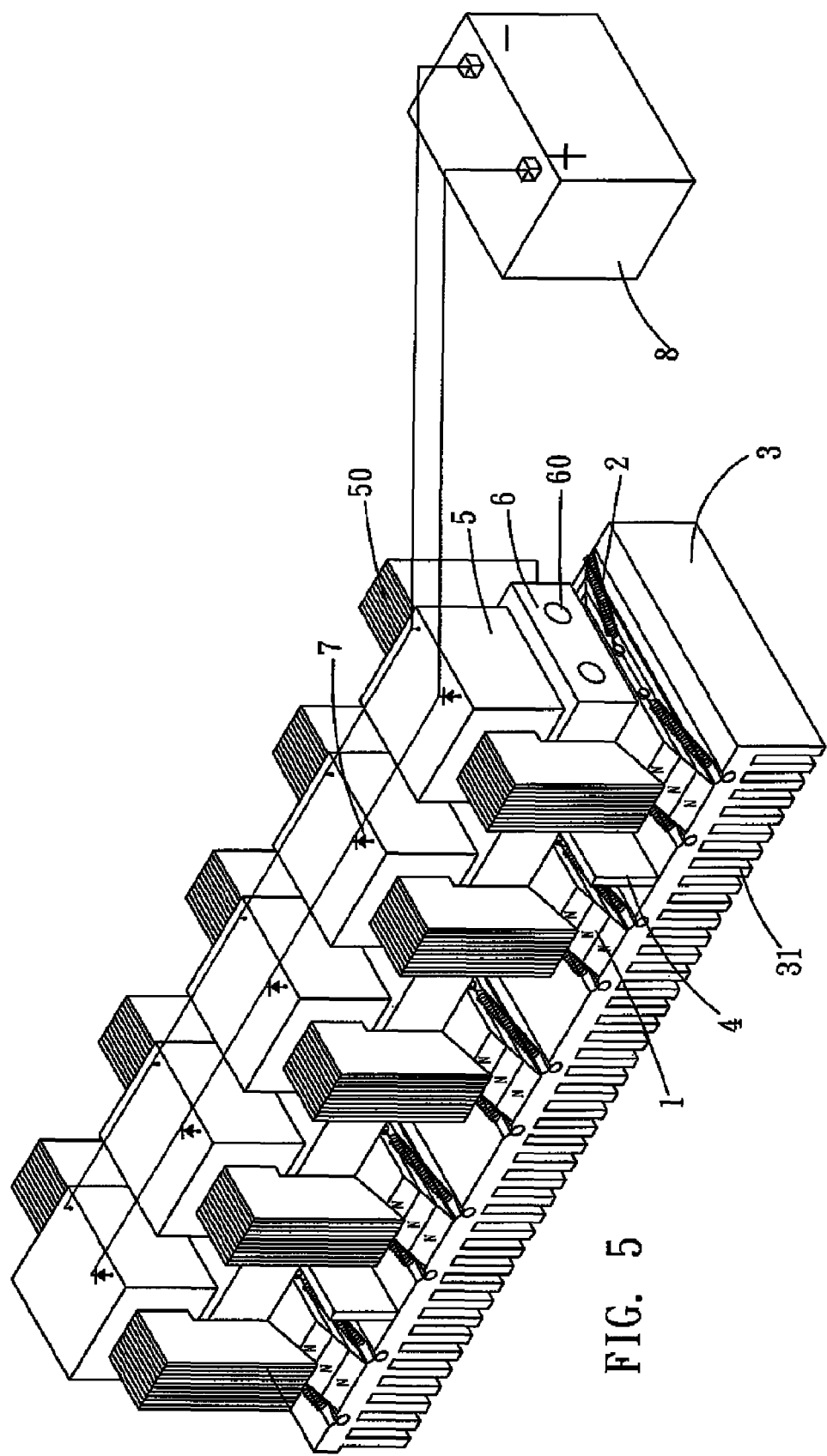
FIG. 5 is a perspective view of a generating apparatus in accordance with another preferred embodiment of the present invention.
Figure 6:
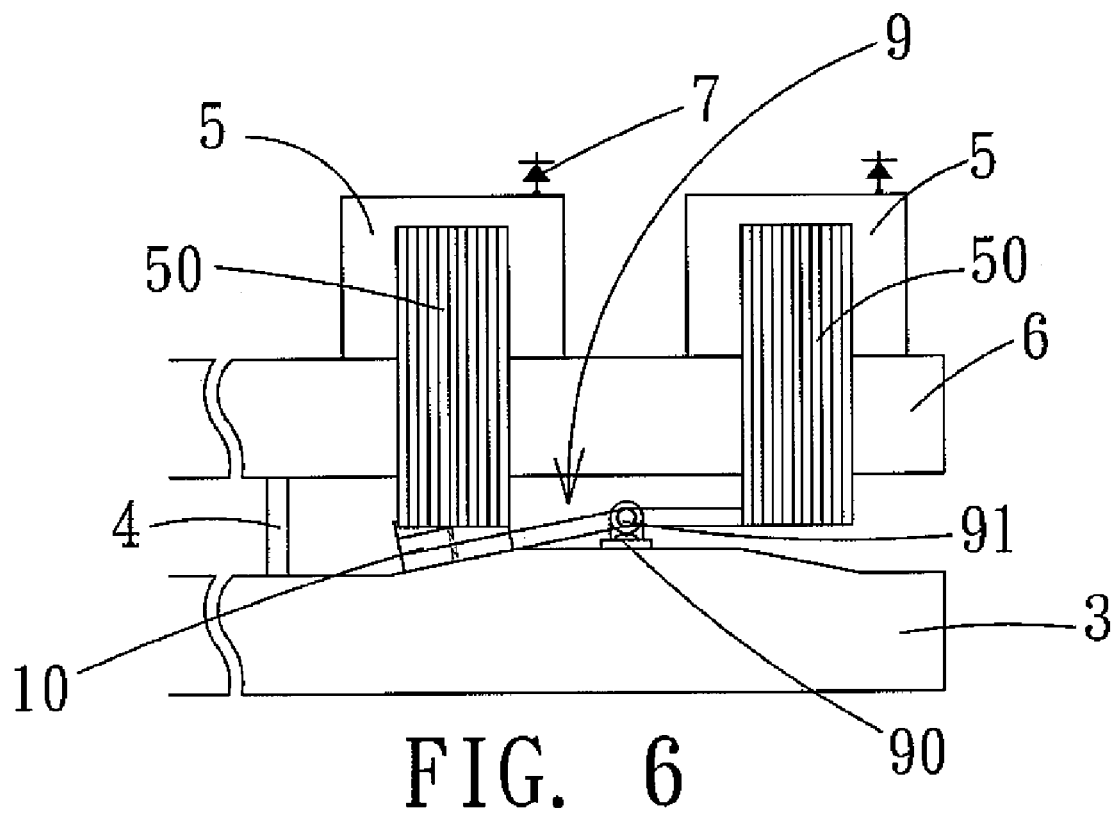
FIG. 6 is a partially front view of a generating apparatus in accordance with another preferred embodiment of the present invention.
Figure 7:
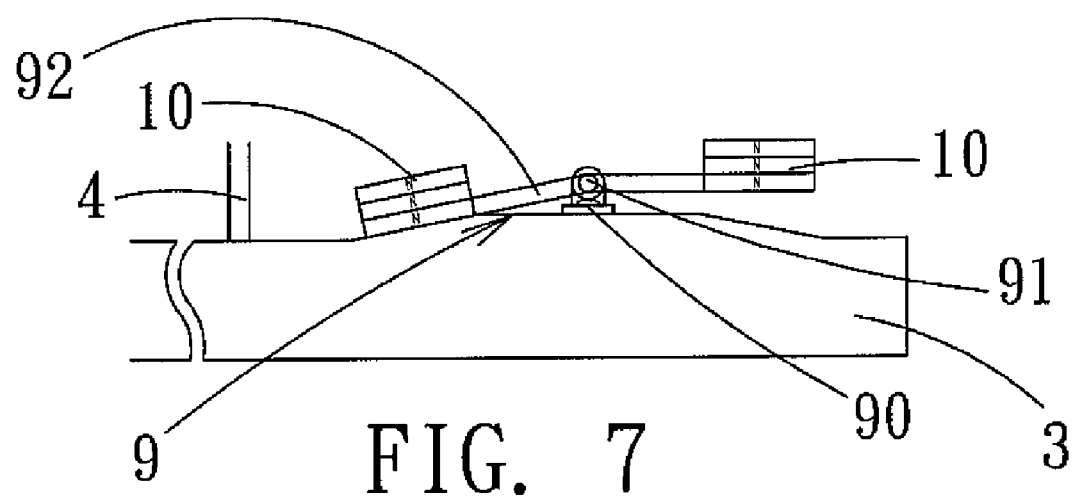
FIG. 7 is a partially front view of the generating apparatus as shown in FIG. 6.
Figure 8:
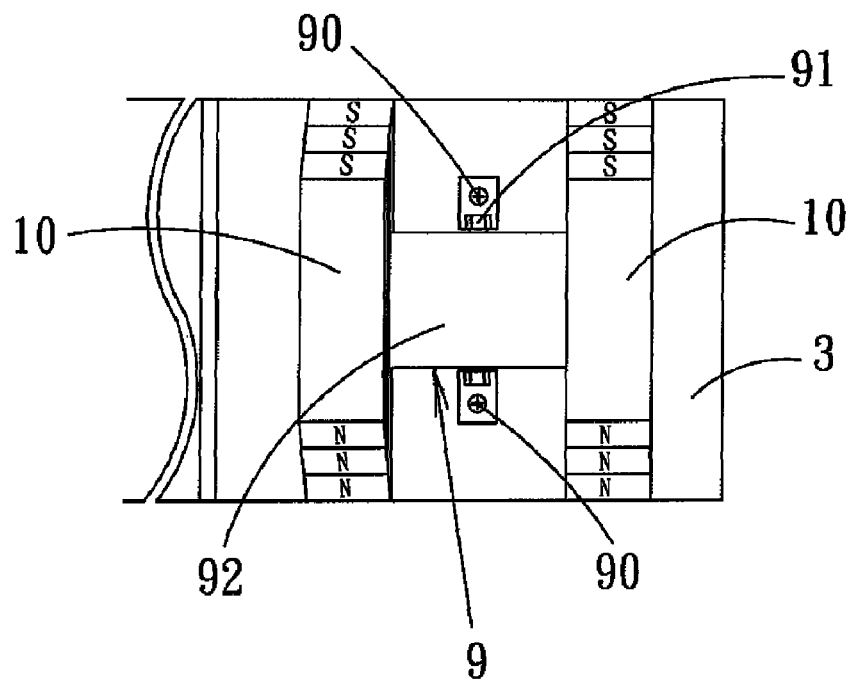
FIG. 8 is a top view of the generating apparatus as shown in FIG. 6.
Figure 9:
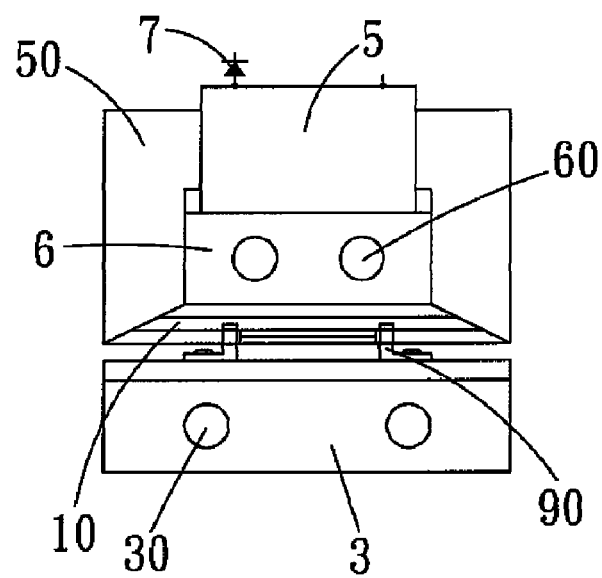
FIG. 9 is a side view of the generating apparatus as shown in FIG. 6.

As shown in FIG. 5, the lower temperature portion 3 has a surface provided with a plurality of heat dissipation portions 31 that co-operate with a cooling fan so as to cool the lower temperature portion 3 forcibly.

Referring to FIGS. 6-9, a generating apparatus using a temperature difference in accordance with the preferred embodiment of the present invention comprises a higher temperature portion including at least one pair of iron cores 50 and having a first temperature greater than a predetermined Curie temperature, at least one pair of coils 5 each surrounding a respective iron core 50 of the higher temperature portion, a lower temperature portion 3 having a second temperature smaller than the predetermined Curie temperature, a seesaw mechanism 9 mounted on the lower temperature portion 3 and including a pivot plate 92 pivotable relative to the lower temperature portion 3, and at least one pair of magnets 10 mounted on two opposite ends of the pivot plate 92 of the seesaw mechanism 9 respectively to move therewith and each movable reciprocally between a respective iron core 50 of the higher temperature portion and the lower temperature portion 3, wherein each of the pair of magnets 10 has a magnetic force that exists when a third temperature of each of the pair of magnets 10 is smaller than the predetermined Curie temperature and disappears when the third temperature of each of the pair of magnets 10 is greater than the predetermined Curie temperature.

The seesaw mechanism 9 further includes a support seat 90 mounted on the lower temperature portion 3, and a pivot shaft 91 pivotally mounted on the support seat 90 and extending through a middle portion of the pivot plate 92 so that the pair of magnets 10 are pivotable about the pivot shaft 91 and movable in two different directions.

The higher temperature portion is preheated by a heat source (not shown) to have the first temperature greater than the predetermined Curie temperature, and the lower temperature portion 3 is located at a height smaller than that of the higher temperature portion and cooled by a cold source (not shown) to have the second temperature smaller than the predetermined Curie temperature. Preferably, the lower temperature portion 3 is a heatsink.

The higher temperature portion further includes a heat conducting member 6 connected to the heat source and located above the magnet 10 to support the pair of iron cores 50. Thus, the pair of iron cores 50 and the heat conducting member 6 of the higher temperature portion are preheated by the heat source to have the first temperature greater than the predetermined Curie temperature. The generating apparatus further comprises a support frame 4 mounted between the lower temperature portion 3 and the heat conducting member 6 of the higher temperature portion to space the pair of iron cores 50 of the higher temperature portion from the pair of magnets 10, at least one pair of rectifiers 7 each mounted on a respective coil 5, and a storage battery 8 connected between the pair of rectifiers 7 and the pair of coils 5 respectively.

In operation, when a first one of the pair of magnets 10 touches the lower temperature portion 3, the first one of the pair of magnets 10 is cooled, and the third temperature of the first one of the pair of magnets 10 is decreased until the third temperature of the first one of the pair of magnets 10 is smaller than the predetermined Curie temperature so that the magnetic force of the first one of the pair of magnets 10 exists. In such a manner, the magnetically attractive force between the first one of the pair of magnets 10 and the respective iron core 50 of the higher temperature portion overcomes the gravity of the first one of the pair of magnets 10 so that the first one of the pair of magnets 10 is movable toward the respective iron core 50 of the higher temperature portion to change a magnetic flux in the respective iron core 50 of the higher temperature portion and to induce a pulse voltage or current in the respective coil 5. Then, the pulse voltage or current in the respective coil 5 is rectified by the respective rectifier 7 to charge the storage battery 8 so that the storage battery 8 obtains a charging unit.

On the other hand, when the first one of the pair of magnets 10 touches the respective iron core 50 of the higher temperature portion, the first one of the pair of magnets 10 is heated, and the third temperature of the first one of the pair of magnets 10 is increased until the third temperature of the first one of the pair of magnets 10 is greater than the predetermined Curie temperature so that the magnetic force of the first one of the pair of magnets 10 disappears to remove the magnetically attractive force between the first one of the pair of magnets 10 and the respective iron core 50 of the higher temperature portion.

On the contrary, when the first one of the pair of magnets 10 is movable to touch the respective iron core 50 of the higher temperature portion, a second one of the pair of magnets 10 is movable to touch the lower temperature portion 3. In such a manner, when the second one of the pair of magnets 10 touches the lower temperature portion 3, the second one of the pair of magnets 10 is cooled, and the third temperature of the second one of the pair of magnets 10 is decreased until the third temperature of the second one of the pair of magnets 10 is smaller than the predetermined Curie temperature so that the magnetic force of the second one of the pair of magnets 10 is restored, and the second one of the pair of magnets 10 is movable toward the respective iron core 50 of the higher temperature portion to change a magnetic flux in the respective iron core 50 of the higher temperature portion and to induce a pulse voltage or current in the respective coil 5. Then, the pulse voltage or current in the respective coil 5 is rectified by the respective rectifier 7 to charge the storage battery 8 so that the storage battery 8 obtains another charging unit. At this time, when the second one of the pair of magnets 10 is movable to touch the respective iron core 50 of the higher temperature portion, the first one of the pair of magnets 10 is movable to touch the lower temperature portion 3 again. Thus, when the first one of the pair of magnets 10 touches the lower temperature portion 3 again, the first one of the pair of magnets 10 is cooled, and the third temperature of the first one of the pair of magnets 10 is decreased until the third temperature of the first one of the pair of magnets 10 is smaller than the predetermined Curie temperature so that the magnetic force of the first one of the pair of magnets 10 is restored.

The above-mentioned procedures are repeated continuously to generate an electric power so as to charge the storage battery 8 successively. It is to be noted that the generating apparatus is operated successively when the temperature difference exists, that is, when the higher temperature portion is heated to have the first temperature greater than the predetermined Curie temperature, and the lower temperature portion 3 is cooled to have the second temperature smaller than the predetermined Curie temperature. On the contrary, the generating apparatus will stop operating when the heat source disappears or when the cooling effect is poor.

Accordingly, the heat source is got easily in an inexpensive or a free manner, thereby decreasing the price of the generating apparatus. In addition, the generating apparatus is operated under a smaller temperature difference between the higher temperature portion and the lower temperature portion 3, thereby increasing the working efficiency. Further, the generating apparatus has a simplified construction, produces a lower noise and will not cause an environmental pollution. Further, the generating apparatus has a longer lifetime without needing maintenance. Further, the generating apparatus is operated safely and reliably.

In practice, when the generating apparatus is applied in a power plant, the heat source (or heating fluid) for heating the heat conducting member 6 of the higher temperature portion is the high temperature waste water produced by a steam turbine of the power plant, the cold source (or cooling fluid) for cooling the lower temperature portion 3 is the air (cooling fan) or seawater, and the predetermined Curie temperature of the magnet 10 is about at 70° C. Alternatively, when the generating apparatus is applied in the sea, the heat source is higher temperature seawater at the sea level, the cold source is lower temperature seawater under the sea level, and the predetermined Curie temperature of the magnet 10 is about at 20° C. Alternatively, when the generating apparatus is applied in the heatsink of a car, the heat source is circulation cooling water for dissipating heat of the car, the cold source is the air (cooling fan), and the predetermined Curie temperature of the magnet 10 is about at 55° C. Alternatively, when the generating apparatus is applied in a roof or road, the heat source is a circulation water pipe of the roof or road, the cold source is the air (cooling fan), and the predetermined Curie temperature of the magnet 10 is about at 45° C.

Although the invention has been explained in relation to its preferred embodiment(s) as mentioned above, it is to be understood that many other possible modifications and variations can be made without departing from the scope of the present invention. It is, therefore, contemplated that the appended claim or claims will cover such modifications and variations that fall within the true scope of the invention.

The invention claimed is:

1. A generating method using a temperature difference, comprising:
   providing a higher temperature portion which includes at least one iron core and has a first temperature greater than a predetermined Curie temperature;
   providing at least one coil which surrounds the iron core of the higher temperature portion;
   providing a lower temperature portion which has a second temperature smaller than the predetermined Curie temperature;
   providing at least one magnet which is movable reciprocally between the iron core of the higher temperature portion and the lower temperature portion, wherein the magnet has a magnetic force that exists when a third temperature of the magnet is smaller than the predetermined Curie temperature and disappears when the third temperature of the magnet is greater than the predetermined Curie temperature;
   providing at least one elastic member between the magnet and the lower temperature portion.

2. The generating method in accordance with claim 1, wherein
   when the magnet touches the lower temperature portion, the magnet is cooled, and the third temperature of the magnet is decreased until the third temperature of the magnet is smaller than the predetermined Curie temperature so that the magnetic force of the magnet exists, and the magnet is movable toward the iron core of the higher temperature portion by a magnetically attractive force between the iron core of the higher temperature portion and the magnet;

when the magnet touches the iron core of the higher temperature portion, the magnet is heated, and the third temperature of the magnet is increased until the third temperature of the magnet is greater than the predetermined Curie temperature so that the magnetic force of the magnet disappears to remove the magnetically attractive force between the iron core of the higher temperature portion and the magnet, and the magnet is movable toward the lower temperature portion by a restoring force of the elastic member.

3. The generating method in accordance with claim 2, wherein the magnet is heated or cooled by a temperature difference between the higher temperature portion and the lower temperature portion, and the magnetic force of the magnet changes at the predetermined Curie temperature, so that the magnet is movable reciprocally between the iron core of the higher temperature portion and the lower temperature portion by a temperature difference between the higher temperature portion and the lower temperature portion to change a magnetic flux in the iron core of the higher temperature portion and to produce a pulse voltage or current in the coil successively and repeatedly so as to generate an electric power.

4. The generating method in accordance with claim 1, wherein
the higher temperature portion is preheated by a heat source to have the first temperature greater than the predetermined Curie temperature;
the lower temperature portion is cooled by a cold source to have the second temperature smaller than the predetermined Curie temperature.

5. A generating apparatus using a temperature difference, comprising:
a higher temperature portion including at least one iron core and having a first temperature greater than a predetermined Curie temperature;
at least one coil surrounding the iron core of the higher temperature portion;
a lower temperature portion having a second temperature smaller than the predetermined Curie temperature;
at least one magnet mounted on the lower temperature portion and movable reciprocally between the iron core of the higher temperature portion and the lower temperature portion, wherein the magnet has a magnetic force that exists when a third temperature of the magnet is smaller than the predetermined Curie temperature and disappears when the third temperature of the magnet is greater than the predetermined Curie temperature;
at least one elastic member mounted between the magnet and the lower temperature portion to pull the magnet toward the lower temperature portion.

6. The generating apparatus in accordance with claim 5 wherein
the higher temperature portion further includes a heat conducting member connected to the heat source and located above the magnet to support the iron core;
the generating apparatus further comprises
a support frame mounted between the lower temperature portion and the heat conducting member of the higher temperature portion to space the iron core of the higher temperature portion from the magnet on the lower temperature portion;
at least one rectifier mounted on the coil;

a storage battery connected between the rectifier and the coil.

7. The generating apparatus in accordance with claim 5, wherein
the higher temperature portion is preheated by a heat source to have the first temperature greater than the predetermined Curie temperature;
the lower temperature portion is cooled by a cold source to have the second temperature smaller than the predetermined Curie temperature;
the lower temperature portion is a heatsink;
the iron core and the heat conducting member of the higher temperature portion are preheated by the heat source to have the first temperature greater than the predetermined Curie temperature.

8. The generating apparatus in accordance with claim 5, wherein the magnet is heated or cooled by a temperature difference between the higher temperature portion and the lower temperature portion, and the magnetic force of the magnet changes at the predetermined Curie temperature, so that the magnet is movable reciprocally between the iron core of the higher temperature portion and the lower temperature portion by a temperature difference between the higher temperature portion and the lower temperature portion to change a magnetic flux in the iron core of the higher temperature portion and to produce a pulse voltage or current in the coil so as to generate an electric power.

9. The generating apparatus in accordance with claim 5, wherein the heat conducting member of the higher temperature portion has a plurality of conducting holes.

10. The generating apparatus in accordance with claim 5, wherein the lower temperature portion has a plurality of conducting holes.

11. The generating apparatus in accordance with claim 5, wherein the lower temperature portion has a surface provided with a plurality of heat dissipation portions.

12. A generating apparatus using a temperature difference, comprising:
a higher temperature portion including at least one pair of iron cores and having a first temperature greater than a predetermined Curie temperature;
at least one pair of coils each surrounding a respective iron core of the higher temperature portion;
a lower temperature portion having a second temperature smaller than the predetermined Curie temperature;
a seesaw mechanism mounted on the lower temperature portion and including a pivot plate pivotable relative to the lower temperature portion;
at least one pair of magnets mounted on two opposite ends of the pivot plate of the seesaw mechanism respectively to move therewith and each movable reciprocally between a respective iron core of the higher temperature portion and the lower temperature portion, wherein each of the pair of magnets has a magnetic force that exists when a third temperature of each of the pair of magnets is smaller than the predetermined Curie temperature and disappears when the third temperature of each of the pair of magnets is greater than the predetermined Curie temperature.

13. The generating apparatus in accordance with claim 12, wherein the seesaw mechanism further includes a support seat mounted on the lower temperature portion, and a pivot shaft pivotally mounted on the support seat and extending through a middle portion of the pivot plate so that the pair of magnets are pivotable about the pivot shaft and movable in two different directions.

14. The generating apparatus in accordance with claim 12, wherein
- the higher temperature portion further includes a heat conducting member connected to the heat source and located above the magnet to support the pair of iron cores;
- the generating apparatus further comprises
- a support frame mounted between the lower temperature portion and the heat conducting member of the higher temperature portion to space the pair of iron cores of the higher temperature portion from the pair of magnets;
- at least one pair of rectifiers each mounted on a respective coil;
- a storage battery connected between the pair of rectifiers and the pair of coils respectively.

15. The generating apparatus in accordance with claim 12, wherein
- the higher temperature portion is preheated by a heat source to have the first temperature greater than the predetermined Curie temperature;
- the lower temperature portion is cooled by a cold source to have the second temperature smaller than the predetermined Curie temperature;
- the lower temperature portion is a heatsink;
- the pair of iron cores and the heat conducting member of the higher temperature portion are heated by the heat source to have the first temperature greater than the predetermined Curie temperature.

16. The generating apparatus in accordance with claim 12, wherein the heat conducting member of the higher temperature portion has a plurality of conducting holes.

17. The generating apparatus in accordance with claim 12, wherein the lower temperature portion has a plurality of conducting holes.

18. The generating apparatus in accordance with claim 12, wherein the lower temperature portion has a surface provided with a plurality of heat dissipation portions.

* * * * *